(12) United States Patent
Hyun et al.

(10) Patent No.: US 6,833,653 B2
(45) Date of Patent: Dec. 21, 2004

(54) PIEZOELECTRIC TRANSFORMER DEVICE AND HOUSING FOR PIEZOELECTRIC TRANSFORMER AND METHOD OF MANUFACTURING THEM

(75) Inventors: Bu Whan Hyun, Kyungki-do (KR); Wook Hee Lee, Kyungki-do (KR); Gi Lyong Na, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 161 days.

(21) Appl. No.: 10/170,454

(22) Filed: Jun. 14, 2002

(65) Prior Publication Data

US 2003/0193270 A1 Oct. 16, 2003

(30) Foreign Application Priority Data

Apr. 11, 2002 (KR) .................................. 10-2002-19700

(51) Int. Cl.[7] .............................................. H01L 41/08
(52) U.S. Cl. ...................................... 310/344; 310/348
(58) Field of Search ................................. 310/344, 348, 310/366

(56) References Cited

U.S. PATENT DOCUMENTS 5,747,916 A * 5/1998 Sugimoto et al. ........... 310/348
5,847,491 A * 12/1998 Taihaku et al. ............. 310/355
5,929,553 A * 7/1999 Suzuki et al. ............... 310/355
6,054,798 A * 4/2000 Sato et al. .................. 310/348
6,057,633 A * 5/2000 Inoi et al. ................... 310/345
6,097,132 A * 8/2000 Inoi et al. ................... 310/345

FOREIGN PATENT DOCUMENTS

JP          08-032135          2/1996

* cited by examiner

Primary Examiner—Mark Budd
(74) Attorney, Agent, or Firm—Lowe Hauptman Gilman & Berner, LLP

(57) ABSTRACT

A housing having lead frames which are protruded to contact and to resiliently support a piezoelectric transformer and a method of manufacturing the housing is disclosed. The housing has an upper housing part having at least two first lead frames protruded to resiliently contact input and output portions of an upper surface of the piezoelectric transformer, and a lower housing part having at least two second lead frames protruded to resiliently come into contact with the input and output portions of a lower surface of the piezoelectric transformer. The first and second lead frames are outwardly extended from the upper and lower housing parts, and the piezoelectric transformer is received in the upper and lower housing parts such that the piezoelectric transformer is resiliently supported by the first and second lead frames. By integral construction of the housing and the lead frames of the piezoelectric transformer, the housing affords easy contact with the transformer and prevention of breakage of the contact.

45 Claims, 13 Drawing Sheets

PIEZOELECTRIC TRANSFORMER DEVICE AND HOUSING FOR PIEZOELECTRIC TRANSFORMER AND METHOD OF MANUFACTURING THEM

BACKGROUND OF THE INVENTION

1. Field of the Invention

The present invention relates to a piezoelectric transformer device, a housing for the piezoelectric transformer, and a method of manufacturing them, and more particularly to a piezoelectric transformer device, a housing for the piezoelectric transformer, and a method of manufacturing them, in which the housing has integral lead frames resiliently protruded to contact input and output portions of the piezoelectric element, and is comprised of a pair of housing parts surrounding both sides of the piezoelectric transformer, and the lead frames are outwardly extended from the housing.

2. Description of the Prior Art

In general, piezoelectric transformers are widely used these days because the piezoelectric transformer can be reduced in its size and thickness as compared with a coil type transformer, and is characterized by high efficiency and insulation performance and incombustibility. Such piezoelectric transformers are used with inverters for back-lights of color liquid crystal displays and high voltage generating circuits. At the moment, products in which a back-light inverter of a color liquid crystal display is incorporated include notebooks, PDAs (Personal Digital Assistants), DVCs (Digital Video Cameras), DSCs (Digital Still Cameras), and high voltage generating circuits are used in dust collectors, air purifiers and ozone generators.

A construction and operating principles of a piezoelectric transformer will be described as follows. In the piezoelectric transformer which is known as a DC high voltage generating circuit, when a driving portion of the piezoelectric transformer is applied with its inherent resonant frequency, high voltage is induced at a vibrating portion by its piezoelectric effect. Although piezoelectric transformers can be classified into various kinds of piezoelectric transformers, a Rosenberg type piezoelectric transformer, which employs longitudinal vibration of a rectangular piezoelectric ceramic, is generally used.

FIG. 1 shows a construction of the Rosenberg type piezoelectric transformer. As shown in the drawing, an input portion 120 is symmetrically provided at its upper and lower surfaces with electrode faces 110, and an output portion 130 is provided at its end surface with electrode faces 140. The input portion 120 having the input electrodes 110 is polarized in the thickness (T) direction, and the output portion 130 having the output electrode is polarized in the lengthwise (L) direction. When the input electrode is applied with AC voltage corresponding to resonant frequency of the piezoelectric element, voltage is generated from the output electrode by piezoelectric effect and thus electric power is supplied to a load. That is, AC voltage applied to the input portion is converted to higher voltage at the output portion via ultrasonic mechanical vibration, thereby increasing voltage.

As illustrated in the above, a piezoelectric transformer comprises the input portion 120 and the output portion 130. The input portion serves as a driving portion for converting input electrical energy into mechanical vibration energy, and includes input electrodes at its upper and lower surfaces. The output portion serves as a generating portion for converting the mechanical vibration energy into electrical energy, and includes the output electrode at its right end surface. When the input portion is applied with electric voltage, the input portion is mechanically vibrated. The mechanical vibration is transmitted to the output portion in the lengthwise direction and thus piezoelectric effect occurs due to the mechanical vibration, thereby generating electric voltage. A ratio of input voltage to output voltage is determined by shapes of input portion and output portion of a piezoelectric transformer.

FIG. 2 shows a shape and electrode patterns of a single plate type λ mode piezoelectric transformer. As shown in the drawing, an input portion of the piezoelectric transformer is printed with input electrodes 210 at its upper and lower surface, and an output portion of the piezoelectric transformer is provided at its end with a "U"-shaped output electrode 220.

A conventional housing for accommodating such a piezoelectric transformer is illustrated in FIGS. 3 and 4. A piezoelectric transformer and a housing shown in FIGS. 3 and 4 are disclosed in Japanese Patent Laid-Open No. 8-32135. Solder wires 305 and 306 are connected to the center of node supporting points of an input portion and an output portion of the λ mode piezoelectric transformer 301 and then connected to a plastic housing 307. The housing is provided with holding protrusions 308 at 4 positions, which are intended to hold the solder wires 305 and 306 extended from the input portion and the output portion. The piezoelectric transformer 301 is applied with adhesive and then attached in the housing 307.

Such a housing for a conventional piezoelectric transformer has a simple construction. However, since both electrode portions of a piezoelectric transformer are soldered with solder wires 305 and 306 and the piezoelectric transformer is mounted on a PCB 310, mass production and quality improvement are difficult due to connection of wires and manufacturing cost is increased due to breakage of wires and an increased number of procedures.

SUMMARY OF THE INVENTION

Accordingly, the present invention has been made keeping in mind the above problems occurring in the prior art, and an object of the present invention is to provide a contact structure of a piezoelectric transformer and a housing in which lead frames are integrally formed with the housing to allow the lead frames to easily contact the piezoelectric transformer and to prevent breakage of the contact.

Another object of the present invention is to provide a housing, which has lead frames, adapted to resiliently support a piezoelectric transformer to improve structural stability and operational effect.

In order to accomplish the above object, the present invention provides a housing for receiving a piezoelectric transformer having a voltage input portion and a voltage output portion, both of which include a plurality of electrodes, including an upper housing part having at least two first lead frames which are protruded at ends thereof to resiliently come into contact with a point of the input portion and a point of the output portion of an upper surface of the piezoelectric transformer. Furthermore, the housing includes a lower housing part having at least two second lead frames which are protruded at ends thereof to resiliently come into contact with a point of the input portion and a point of the output portion of a lower surface of the piezoelectric transformer. The first and second lead frames are outwardly extended from the upper and lower housing parts, and the piezoelectric transformer is received in the upper and lower housing parts such that the piezoelectric transformer is resiliently supported by the first and second lead frames.

According to another embodiment, the present invention provides a housing for receiving a piezoelectric transformer having upper and lower surfaces and side surfaces connecting the upper and lower surfaces, and having a voltage input portion and a voltage output portion, both of which include a plurality of electrodes, including an upper housing part surrounding the upper surface and the side surfaces of the piezoelectric transformer, and having I) at least two first openings formed thereon, and II) at least two first lead frames made of conductive elastic material, each of which is extended from one of the side surfaces into the inside of the first opening of the upper housing part and is protruded at the extended end to be in contact with at least one electrode of the piezoelectric transformer. Furthermore, the housing includes a lower housing part surrounding the lower surface and the side surfaces of the piezoelectric transformer, and having i) at least two second openings formed thereon, and ii) at least two second lead frames made of conductive elastic material, each of which is extended from one of the side surfaces into the inside of the second opening of the lower housing part and is protruded at the extended end to be in contact with at least one electrode of the piezoelectric transformer.

According to a further embodiment, the present invention provides a housing for receiving a piezoelectric transformer having upper and lower surfaces and side surfaces connecting the upper and lower surfaces, and having a voltage input portion and a voltage output portion at side surfaces thereof, both of which include a plurality of electrodes, including a first housing part surrounding one of the side surfaces of the piezoelectric transformer on which the electrodes are formed, and having I) at least two first openings formed thereon which are positioned at locations corresponding to the electrodes of the piezoelectric transformer, and II) at least two first lead frames made of conductive elastic material, each of which is extended from a side surface into the inside of the first opening of the upper housing part and is protruded at the extended end to be in contact with at least one electrode of the piezoelectric transformer. Furthermore, the housing includes a second housing part surrounding the other of the side surfaces of the piezoelectric transformer on which the electrodes are formed, and having i) at least two second openings formed thereon which are positioned at locations corresponding to the electrodes of the piezoelectric transformer, and ii) at least two second lead frames made of conductive elastic material, each of which is extended from a side surface into the inside of the second opening of the lower housing part and is protruded at the extended end to be in contact with at least one electrode of the piezoelectric transformer. In addition, the housing includes a clip fitted on the center portion of the first housing part and the center portion of the second housing part to couple the first and second housing parts to each other.

The present invention provides a method of manufacturing a housing for receiving a piezoelectric transformer having a voltage input portion and a voltage output portion, comprising the steps of: preparing a pair of lead frames comprised of rectangular ring-shaped frames, each of which is cut away at one side, the cut ends of the lead frames being protruded laterally to come into contact with input and output contact points of the piezoelectric transformer; providing a pair of housing parts, for receiving the piezoelectric transformer, on the cut ends of the lead frames by carrying out an injection molding on the cut ends of the lead frames and forming openings at the housing parts such that the cut ends of the lead frames are protruded therethrough to resiliently support the piezoelectric transformer; removing lead frames outwardly extended from the pair of housing parts except lead end portions of the lead frames; and bending the lead ends toward a surface of the housing parts to contact the surface, thereby allowing the housing parts to be mounted on a PCB.

In addition, the present invention provides a piezoelectric transformer device comprising: a piezoelectric transformer having rectangular upper and lower surfaces and side surfaces connecting the upper and lower surfaces, and having an input portion formed at upper and lower surfaces of one half part of two half parts of the piezoelectric transformer which are longitudinally and equally divided and an output portion formed at parts of side surfaces and an upper surface adjacent to the side surfaces of the other half part of the piezoelectric transformer; an upper housing part surrounding the upper surface and the side surfaces of the piezoelectric transformer, and having I) at least two first openings formed thereon to expose parts of the input and output portions, and II) at least two first lead frames made of conductive elastic material, each of which is extended from one of the side surfaces into the inside of the first opening of the upper housing part and is protruded at the extended end to be in contact with the input and output portions of the piezoelectric transformer; and a lower housing part surrounding the lower surface and the side surfaces of the piezoelectric transformer, and having i) at least two second openings formed thereon to expose parts of the input portion and the piezoelectric transformer, and ii) at least two second lead frames made of conductive elastic material, each of which is extended from one of the side surfaces into the inside of the second opening of the lower housing part and is protruded at the extended end to be in contact with a portion adjacent to the output portion of the piezoelectric transformer.

The present invention also provides a piezoelectric transformer device comprising: a piezoelectric transformer having rectangular upper and lower surfaces and side surfaces connecting the upper and lower surfaces, and having an input portion formed at upper and lower surfaces and side surfaces of a middle portion of the piezoelectric transformer and an output portion formed at upper and lower surfaces and side surfaces of one end of the piezoelectric transformer; an upper housing part surrounding the upper surface and the side surfaces of the piezoelectric transformer, and having I) at least two first openings formed thereon to expose parts of the input and output portions, and II) at least two first lead frames made of conductive elastic material, each of which is extended from one of the side surfaces into the inside of the first opening of the upper housing part and is protruded at the extended end to be in contact with the input and output portions of the piezoelectric transformer; and a lower housing part surrounding the lower surface and the side surfaces of the piezoelectric transformer, and having i) at least two second openings formed thereon to expose parts of the input portion and the piezoelectric transformer, and ii) at least two second lead frames made of conductive elastic material, each of which is extended from one of the side surfaces into the inside of the second opening of the lower housing part and is protruded at the extended end to be in contact with the input and output portions of the piezoelectric transformer.

Furthermore, the present invention provides a piezoelectric transformer device comprising: a piezoelectric transformer having rectangular upper and lower surfaces and side surfaces connecting the upper and lower surfaces, and having an input portion formed at both side surfaces of a middle portion of the piezoelectric transformer and an output portion formed at both side surfaces of one end of the piezoelectric transformer; a first housing part surrounding one side surface of the both side surfaces on which the input and output portions are formed and both end surfaces adjacent to the side surface, and having I) at least two first openings formed thereon to expose parts of the input and output portions, and II) at least two first lead frames made of conductive elastic material, each of which is extended from a side surface into the inside of the first opening of the first housing part and is protruded at the extended end to be in contact with the input and output portions the piezoelectric transformer; a second housing part surrounding the other side surface of the both side surfaces on which the electrodes are formed and both end surfaces adjacent to the side surface, and having i) at least two second openings formed thereon to expose arts of the input and output portions, and ii) second lead frames made of conductive elastic material, each of which is extended from a side surface into the inside of the second opening of the lower housing part and is protruded at the extended end to be in contact with the input and output portions of the piezoelectric transformer; and a clip fitted on the center portion of the first housing part and the center portion of the second housing part to couple the first and second housing parts to each other.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

This invention will be described in further detail by way of example with reference to the accompanying drawings.

Figure 1:
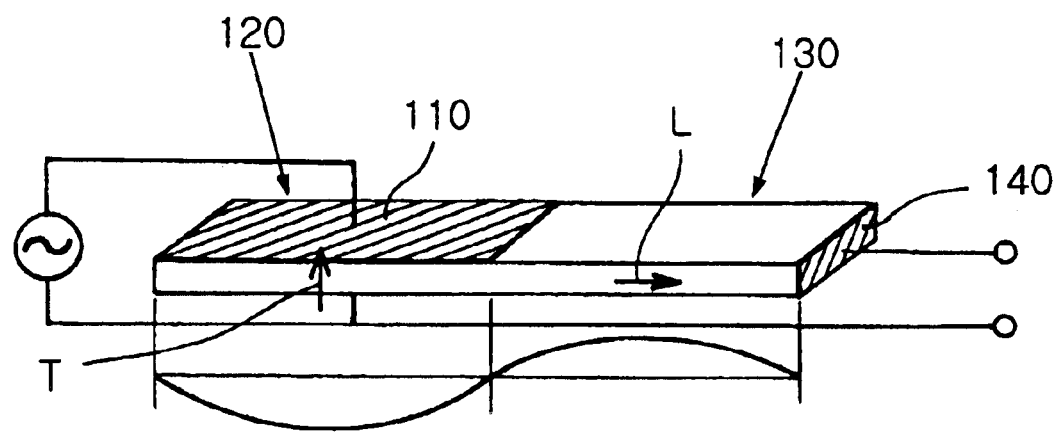
FIG. 1 is a perspective view showing a construction and principle of a Rogenberg type piezoelectric transformer.
Figure 2:
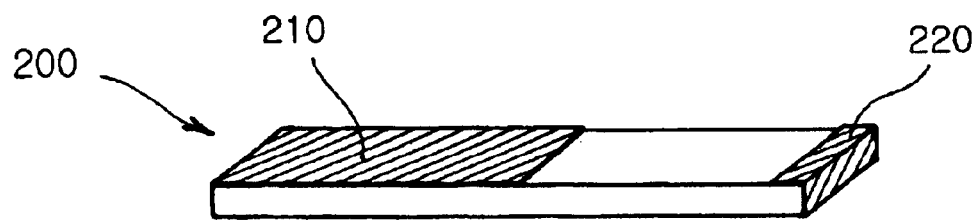
FIG. 2 is a perspective view showing a single plate type piezoelectric transformer.
Figure 3:
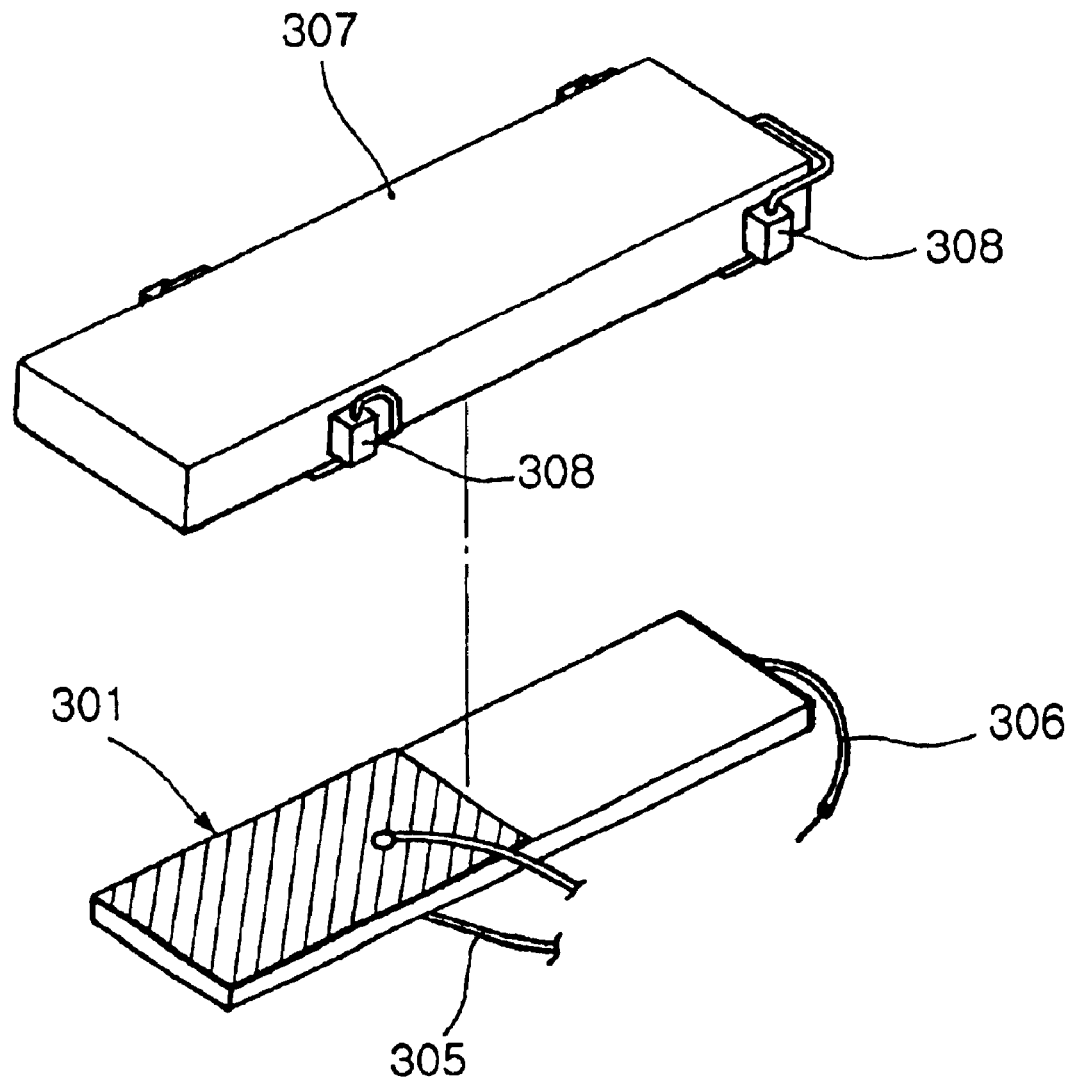
FIG. 3 is a perspective view showing a piezoelectric transformer and a housing therefor according to a prior art.
Figure 4:
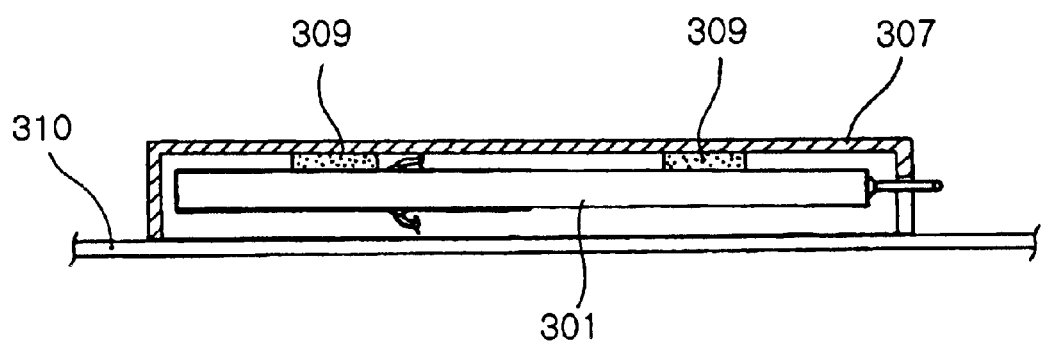
FIG. 4 is a cross-sectional view showing a conventional housing for a piezoelectric transformer in an assembled state.
Figure 5:
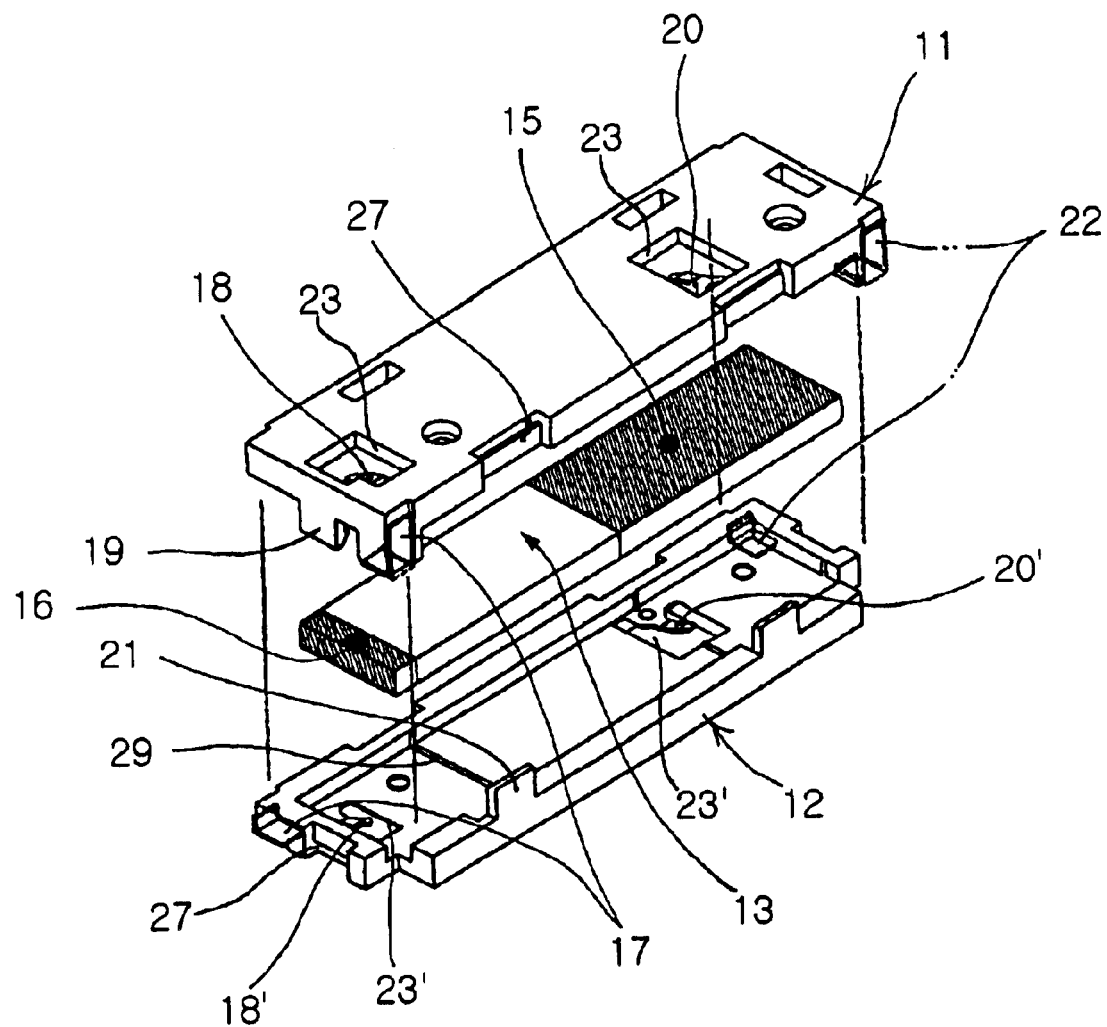
FIG. 5 is an exploded perspective view of a housing for a single plate type piezoelectric transformer according to the present invention.
Figure 6A:
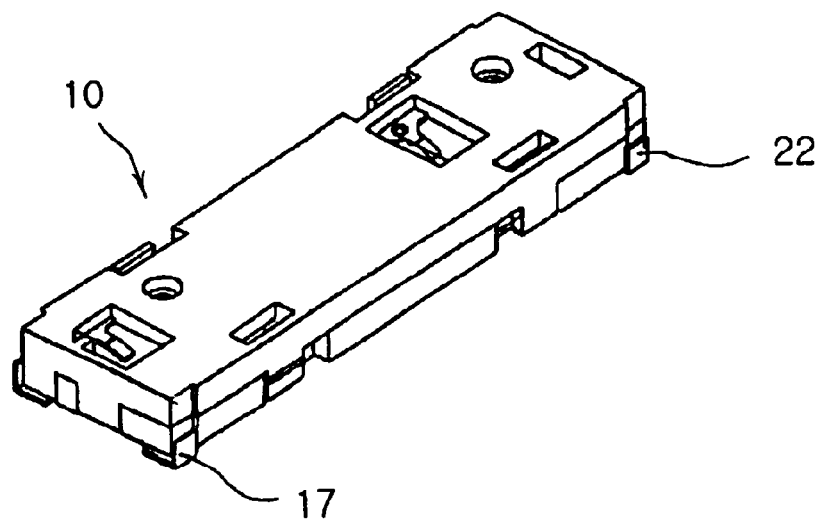
FIG. 6a is a perspective view showing the housing for the single plate type piezoelectric transformer of FIG. 5 in an assembled state.
Figure 6B:
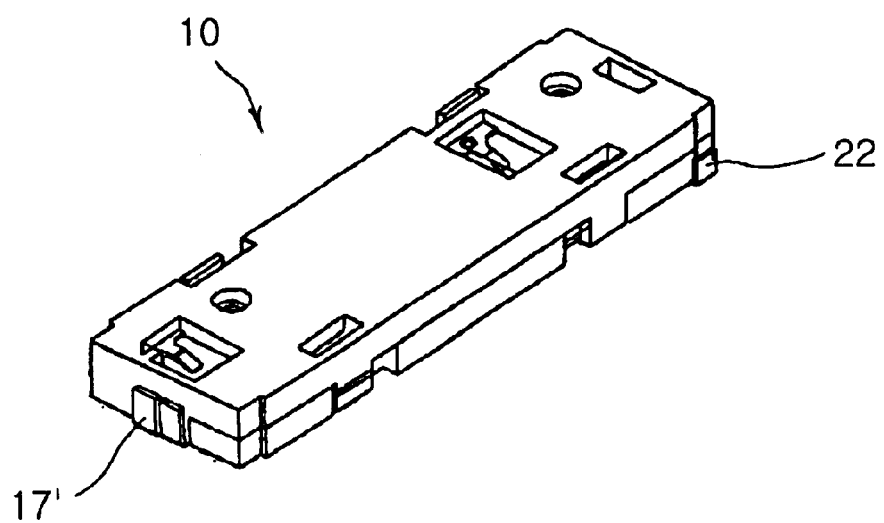
FIG. 6b is a perspective view showing the housing for the single plate type piezoelectric transformer of FIG. 5, which has different output terminals.
Figure 7:
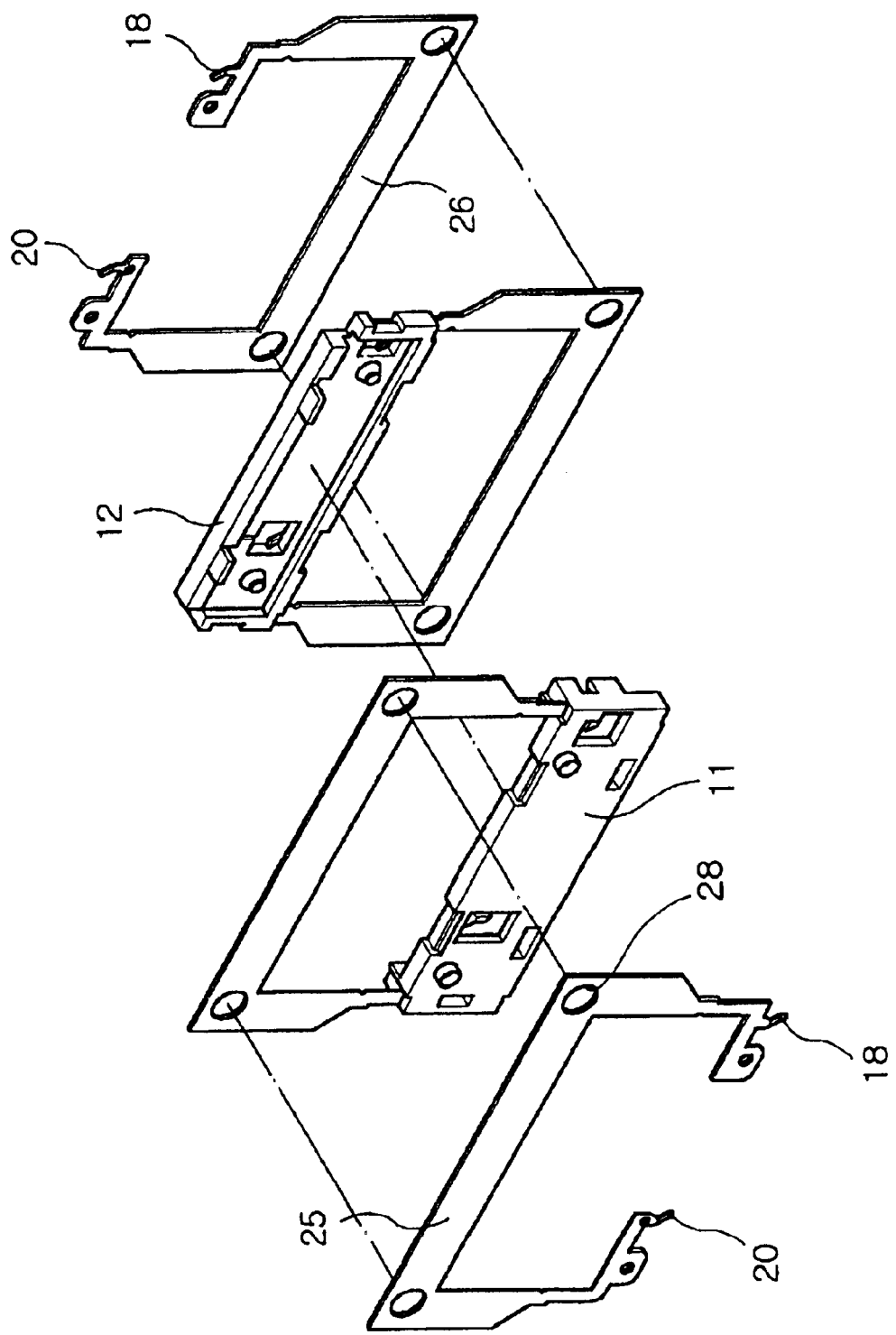
FIG. 7 is a view showing a manufacturing procedure of the housing for the single plate type piezoelectric transformer of FIG. 5.

FIG. 5 is an exploded perspective view of a housing for a single plate type piezoelectric transformer, FIG. 6a is a perspective view showing the housing for the single plate type piezoelectric transformer of the FIG. 5, which is assembled, FIG. 6b is a perspective view showing the housing for the single plate type piezoelectric transformer of FIG. 5, which has different output terminals, and FIG. 7 is a view showing a manufacturing procedure of the housing for the single plate type piezoelectric transformer of FIG. 5.

Referring to FIG. 5, there is shown a piezoelectric transformer and a housing for the piezoelectric transformer according to the present invention, in which the housing surrounding the piezoelectric transformer is comprised of an upper housing part 11 and a lower housing part 12. The piezoelectric transformer 13 has an upper surface, a lower surface and side surfaces connecting the upper and lower surfaces, and is provided with an input portion to which electric voltage is applied, and an output portion from which electric voltage is generated.

In this embodiment, a λ mode piezoelectric transformer is used as a piezoelectric transformer. Accordingly, the input portion is provided at the right half section of the piezoelectric transformer 13, and the right input portion is formed with λ mode input contact points 15 at centers of its upper and lower surfaces. The output portion provided at the left end of the piezoelectric transformer is formed with λ mode output contact points 16 at its center. Although the output contact point 16 is formed at each of upper and lower surfaces of the piezoelectric transformer, it may be formed at only any one of the upper and lower surfaces. The input contact point is usually positioned at a vibration node of the input portion. Therefore, if the piezoelectric transformer is in a λ/2 mode, the input contact points are formed at a position corresponding to ½ of a full length of the piezoelectric element. At these points, input lead frames are in contact with the piezoelectric transformer.

First lead frames 18 and 20 integrally formed with the upper housing part 11 come into contact with the contact points 15 and 16 to obtain electrical connection therebetween. The upper housing part is formed with first openings 23 at positions corresponding to the input contact point 15 and the output contact point 16. The openings 23 are preferably provided in the number of two. Each of the first openings 23 is extended to a middle portion from one side of the upper housing part 11. The first lead frames 18 and 20 are resiliently protruded toward the piezoelectric transformer and come into contact with the piezoelectric transformer. The lower housing part 12 is formed with second openings 23' and second lead frames 18' and 20', which have the same shapes as the first openings 23 and the first lead frame 18 and 20 of the upper housing part 11. One lead frame 18 of the first lead frames 18 and 20 and one lead frame 18' of the second lead frames 18' and 20' come into contact with the output contact points 16, thereby serving as output terminals. The other lead frames 20 and 20' come into contact with the input contact points 15, thereby serving as input terminals. The first and second lead frames 18, 20, 18' and 20' are made of conductive elastic material, and are more preferably made of copper alloys having excellent conductivity. The first and second lead frames are electrically connected to the piezoelectric transformer 13 and serve to resiliently support the piezoelectric transformer 13.

The upper and lower housing parts 11 and 12 are made of plastic material. The lower housing part 12 is provided at sides thereof with at least one hook 19 and 21, and the upper housing part 11 is provided at sides thereof with at least one snap edge 27 mating with the hooks 19 and 21. Therefore, the upper and lower housing parts are coupled to each other by engagement of the hooks 19 and 21 and the snap edges 27.

The first and second lead frames 18, 18', 20 and 20' serving as input and output terminals are extended to the outside of the upper and lower housing parts 11 and 12 and bent to come into close contact with outer side surfaces of the housing parts. The bent end of the lead frames serve as an input PCB solder portion 22 and an output PCB solder portion 17. The solder portions 17 and 22 are in close contact with a lower surface of the housing part, as shown in FIG. 6a.

In this embodiment, it is preferable that the upper and lower housing parts 11 and 12 are internally provided with protrusions 29 to support the piezoelectric transformer 13. The protrusions 29 are preferably shaped as triangular prisms perpendicular to a longitudinal direction of the piezoelectric transformer. The protrusions 29 are positioned at vibration nodes of the piezoelectric transformer. More specifically, the protrusions 29 are positioned at points corresponding to ¼ and ¾ of the length of the piezoelectric transformer, in this embodiment. The protrusions 29 are adapted to afford small gaps between the housings and the piezoelectric transformer to prevent separation of the piezoelectric transformer by vibration, and are adapted to allow the piezoelectric transformer to be easily vibrated. Therefore, the piezoelectric transformer 13 is supported by the first lead frames 18 and 20 and the second lead frames 18' and 20', and is not subjected to any interference in vibration thereof. Furthermore, since direct contact between the piezoelectric transformer and the housing 10 can be prevented by the protrusions 29, it is possible to protect the piezoelectric transformer 13 and the housing 10 and to prevent separation of the piezoelectric transformer by vibration.

Alternatively, the output solder portion 17, which is outwardly extended from the output terminals 18, may be positioned at the center of an end surface of the housing 10, as shown in FIG. 6b. By the output solder portion 17' formed at the center of the end surface of the housing 10, it is possible to prevent interference with other components due to high voltage output and to solve a problem of insulation under high voltage.

Figure 9:
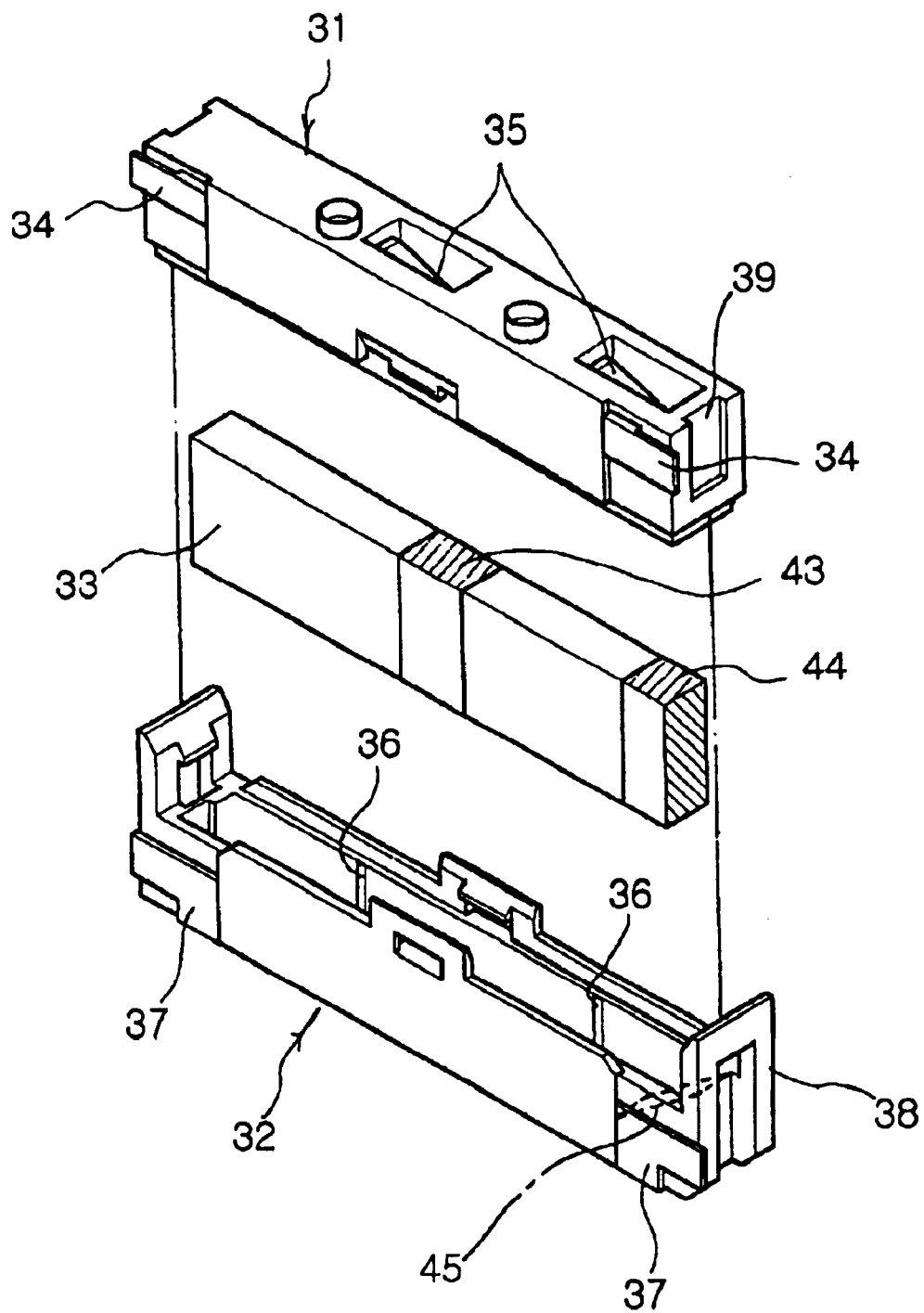
FIG. 9 is an exploded perspective view of a housing for a laminated piezoelectric transformer according to the present invention.
Figure 10:
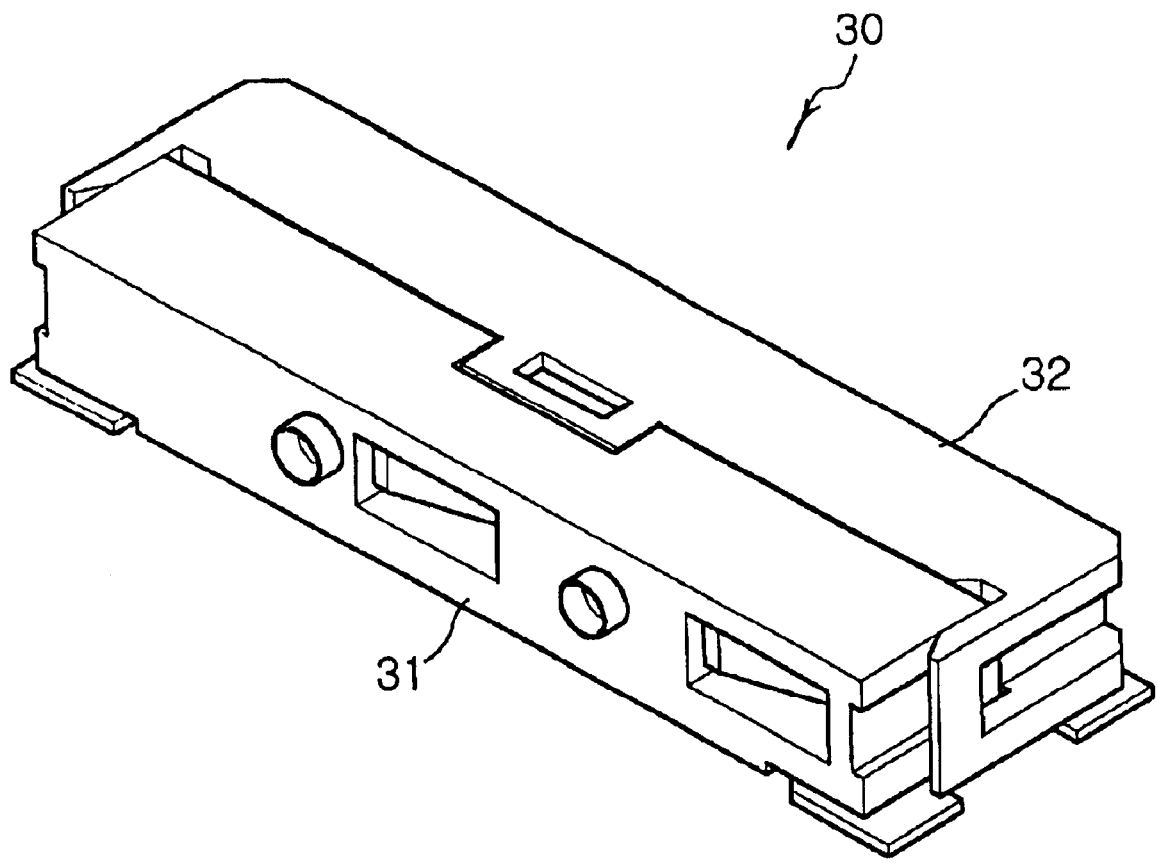
FIG. 10 is a perspective view of the housing of FIG. 9 in an assembled state.
Figure 11:
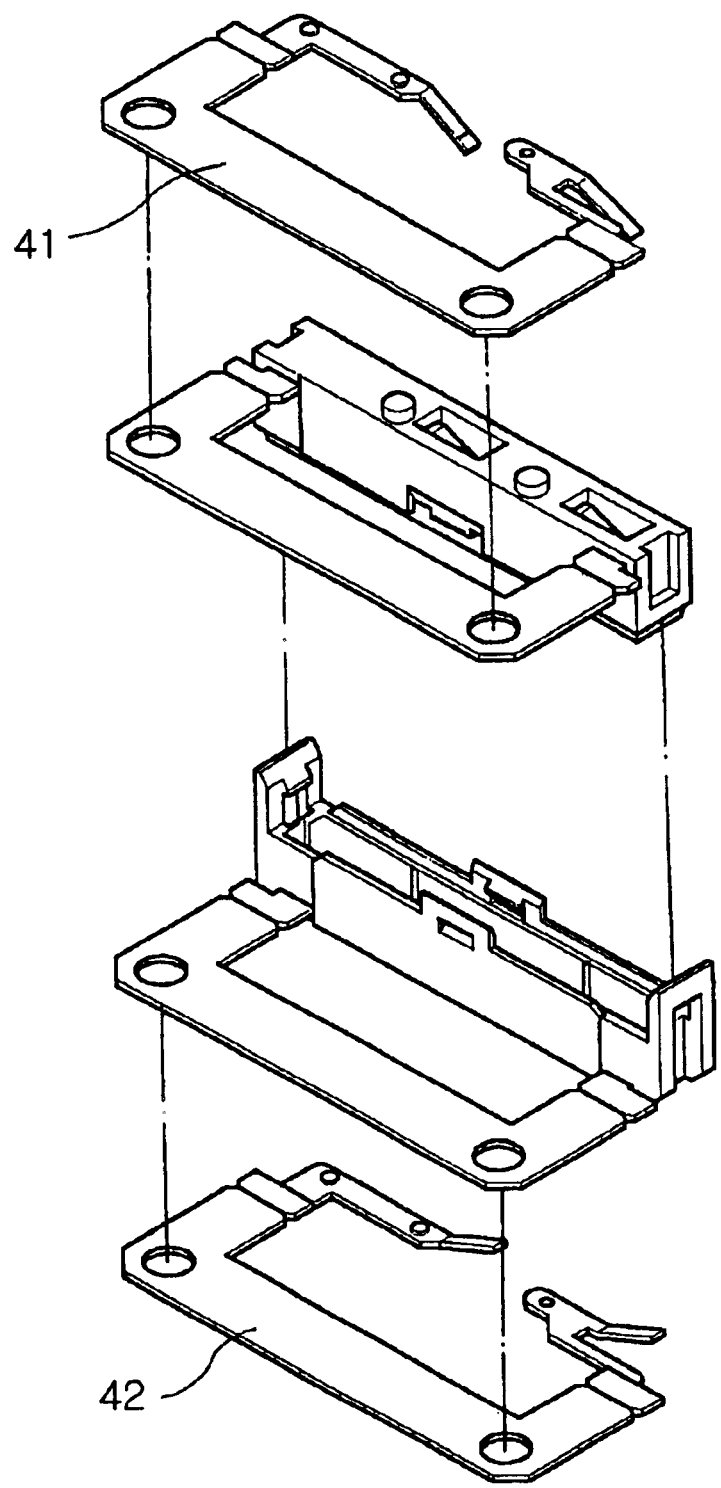
FIG. 11 is a view showing a process of manufacturing the housing of FIG. 9.

Referring to FIGS. 9 to 11, there are shown a piezoelectric transformer and a housing for the piezoelectric transformer according to another embodiment of the present invention. FIG. 9 is an exploded perspective view of a housing for a laminated piezoelectric transformer according to the present invention, FIG. 10 is a perspective view of the housing of FIG. 9, which is assembled, and FIG. 11 is a view showing a process of manufacturing the housing of FIG. 9.

As is the case with the embodiment shown in FIG. 9, the housing according to this embodiment comprises an upper housing part 31 and a lower housing part 32, which are integrally formed with first lead frames 35 and second lead frames 45. The housing according to this embodiment is usually used in a $\lambda/2$ vibration mode.

The upper and lower housing parts 31 and 32 are made of insulation material such as plastic material, and are coupled to each other by hooks 38 and snap edges 39 formed thereon.

This embodiment employs a $\lambda/2$ mode piezoelectric transformer. Accordingly, $\lambda/2$ mode input contact points 43 are formed at positions corresponding to half of the full length of the piezoelectric transformer. In addition, $\lambda/2$ mode output contact points 44 are formed at upper and lower surfaces of a right end of piezoelectric transformer. The contact points 43 and 44 are formed at both surfaces. The output contact point 44 may be formed at any one surface of both surfaces.

Shapes of the lead frames and input and output terminals according to this embodiment are the same as those shown in FIG. 5. The input contact points are usually formed at a vibration node of the input portion of the piezoelectric transformer. If the piezoelectric transformer is in a $\lambda$ mode, the input contact points are positioned at a center of the input portion of the piezoelectric transformer. At these points, the input lead frames come into contact with the piezoelectric transformer.

As in the embodiment shown in FIG. 5, the first and second lead frames 35 and 45 are protruded toward the piezoelectric transformer 33 to resiliently support the piezoelectric transformer and to make electrical contact with the piezoelectric transformer. The first and second lead frames 35 and 45 are outwardly extended from the housing to form solder portions 34 and 37, and the housing is internally provided with protrusions 36, similarly to the embodiment shown in FIG. 5. Output solder portions extended from output terminals and exposed to the outside may be positioned at the center of side walls of the housing, as in the embodiment shown in FIG. 6b.

Figure 12:
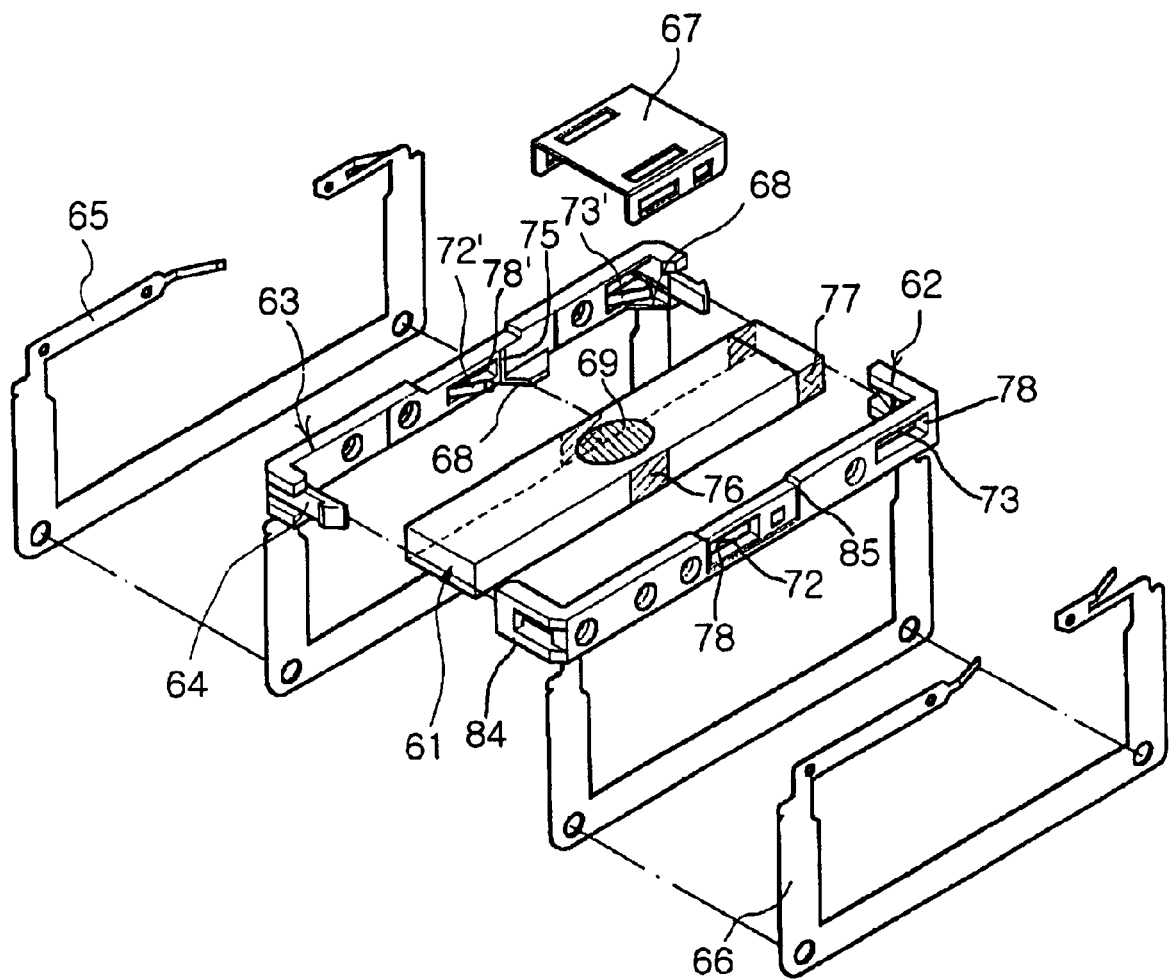
FIG. 12 is a view showing a process of manufacturing a housing for a laminated piezoelectric transformer according to his embodiment.
Figure 13:
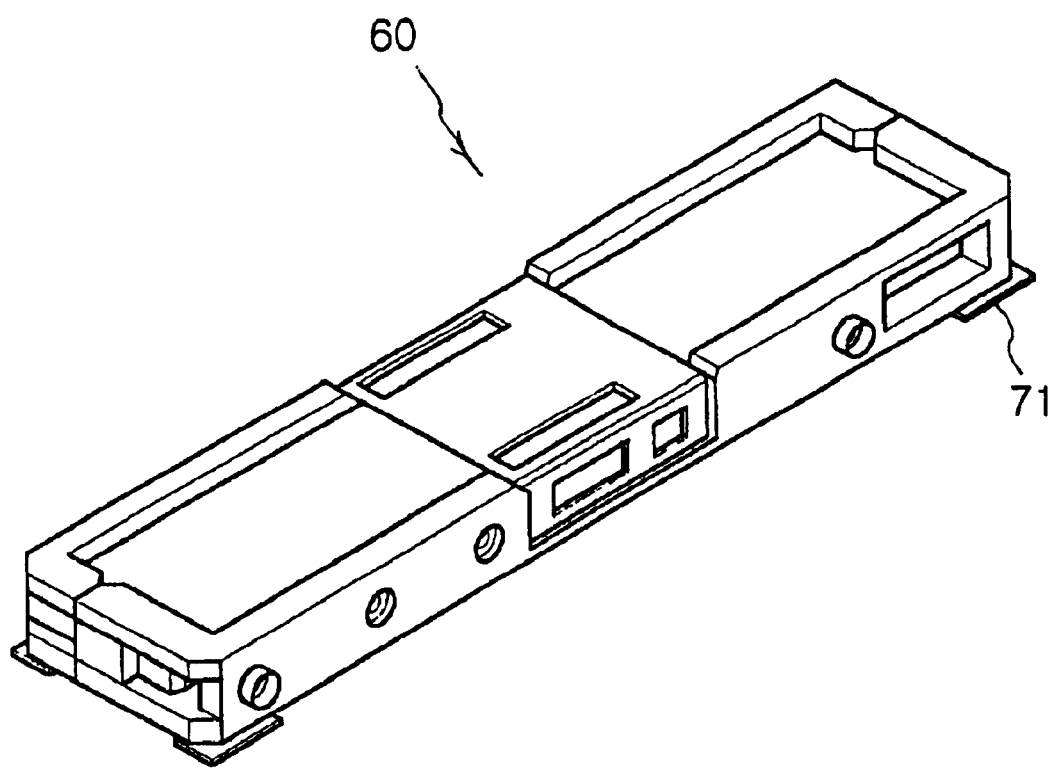
FIG. 13 is a perspective view of the housing of FIG. 12 in an assembled state.

Referring to FIGS. 12 and 13, there are shown a piezoelectric transformer and a housing thereof according to a further embodiment of the present invention. FIG. 12 is a view showing a process of manufacturing a housing for a laminated piezoelectric transformer according to this embodiment, and FIG. 13 is a perspective view of the housing of FIG. 12, which is assembled.

The housing of this embodiment is used with a laminated piezoelectric transformer. Such a laminated piezoelectric transformer is usually used for notebook computers. In general, the piezoelectric transformer has a $\lambda/2$ vibrating mode. Although a basic construction of the housing is substantially the same as the housing for the laminated piezoelectric transformer shown in FIG. 9, since the housing 60 or use with notebook computers is increased in overall size, a first housing 62 and a second housing 63 are first coupled to each other by hooks 64 and snap edges 64 formed at ends hereof, and then more securely coupled by a clip 67 fitted on the middle portion of the housing.

The piezoelectric transformer 61 of this embodiment is provided at its both side surfaces with an input portion and an output portion. Since the piezoelectric transformer adopts $\lambda/2$ mode, the input portion 76 is provided at the centers of the both sides of the piezoelectric transformer while the output portion 77 is provided at the both sides of the end of the piezoelectric transformer.

To surround side surfaces of the piezoelectric transformer 61, the housing 60 is comprised of the first and second housing parts 62 and 63, each of which is formed into a "U" shape. The first housing part 62 is formed with first openings 78 at positions corresponding to the input portion 76 and the output portion 77 of piezoelectric transformer. The first housing part 62 includes first lead frames 72 and 73, which are extended from side surfaces of the housing part 62 defining the first openings toward the inside of the first openings 78. The first lead frame 72 and 73 are protruded toward the piezoelectric transformer 61 to make resilient contact with the piezoelectric transformer 61.

The second housing part 63 is formed with second openings 78' and second lead frames 72' and 73', all of which carry out the same functions as the first openings 78 and the first lead frames 72 and 73 of the first housing part 62. The lead frames 72 and 72' of the first and second lead frames 72, 72', 73 and 73' come into contact with the input portion 76, thereby serving as input terminals. The other lead frames 73 and 73' come into contact with the output portion 77, thereby serving as output terminals. The first and second lead frames 72, 72', 73 and 73' are made of conductive elastic material, and are more preferably made of copper alloys having excellent conductivity. The first and second lead frames are also electrically connected to the piezoelectric transformer 61 and serve to resiliently support the piezoelectric transformer 61.

The first and second housing parts 62 and 63 are made of plastic material. The first and second housing parts 62 and 63 are provided at end surfaces thereof with at least one set of hook and snap edge 64 and 84. Therefore, the first and second housing parts are coupled to each other by engagement of the hooks 64 and the snap edges 84.

The first and second lead frames 72, 72', 73 and 73' serving as input and output terminals are extended to the outside of the first and second housing parts 62 and 63 and bent to come into close contact with outer side surfaces of the housing parts. The bent end of the lead frames serve as an input PCB solder portion 70 and an output PCB solder portion 71. The solder portions 70 and 71 are preferably in close contact with a lower surface of the housing, as shown in FIG. 13.

As is the case with the above embodiments, a position of the input portion depends on a vibration mode of the piezoelectric transformer. The first and second housing parts 62 and 63 are internally provided with supporters 68 to support the piezoelectric transformer 61. Each of the supporters 68 is shaped into a triangle form and provided at lower portions of the housing parts 62 and 63. More specifically, the supporters 68 are internally disposed at corners and mid points of the first and second housing 62 and 63 such that the supporters 68 of the first housing part 62 face the supporters 68 of the second housing part 63.

The clip 67 made of a metal plate is shaped into a "U" form in section, and is attached on the piezoelectric transformer 61 by adhesive 69. The adhesive contains a silicon ingredient to provide a certain resiliency. Each of the first and second housing parts 62 and 63 is preferably provided at its middle portion with a recess 85 in which the clip 67 is fitted. In this embodiment, since the housing parts are shaped to surround only side surfaces of the piezoelectric transformer 61, the housing parts do not have upper and lower surfaces. By adoption of this configuration, an effective height of a housing with respect to a piezoelectric transformer can be minimized in a case of a large-sized LCD product, thereby enabling products to be compact.

As in the above embodiments shown in FIGS. 5 and 9, the first and second housing parts are internally provided with protrusions 75 to support the piezoelectric transformer with gaps therebetween. Furthermore, the output solder portions 71 of this embodiment may be positioned at the centers of end faces of the housing.

A method of manufacturing the housings of the piezoelectric transformers according to the present invention are shown in FIGS. 7, 11 and 12. One of the manufacturing processes of the housings will now be described with reference to FIG. 7.

As shown in FIG. 7, the method of manufacturing the housing for the piezoelectric transformer according to the present invention is initiated from a step of preparing lead frames. In this step, the lead frames are shaped into rectangular ring-shaped lead frames 25 and 26. Each of the lead frames 25 and 26 is cut away at its one side. Ends of the cut sides of the lead frames 25 and 26 are bent to be protruded laterally, thereby forming first lead frames 18 and 20 and second lead frames 18' and 20' to be in contact with input contact points 15 and output contact points 16 of the piezoelectric transformer.

Solid sides of the lead frames 25 and 26, which face the cut sides of the lead frames, are formed at ends thereof with positioning holes 28 to facilitate their coupling to the housing. The positioning holes 28 serve as guide holes for injection molds to precisely position the lead frames relative to injection mold.

Thereafter, the cut sides of the lead frames are subjected to an injection molding procedure using insulation material such as plastic material, thereby affording outer appearances of housing parts. The molded housing parts are formed with first and second openings at positions corresponding to the ends of the lead frames, so that the ends of the lead frames protruded into the openings resiliently support the piezoelectric transformer. Therefore, the ends of the lead frames can be moved slightly up and down to resiliently support the piezoelectric transformer.

Subsequently, the lead frames extended from the housing parts are removed such that only protruded partial lead ends of the lead frames are left. The protruded lead ends are bent to come into contact with lower surfaces of the housing parts, and constitute solder portions. The lead ends may be plated with tin (Sn) to be easily mounted on printed circuit boards.

In the injection molding procedure, the housing parts are preferably formed with protrusions at inner surfaces thereof. The protrusions are positioned at vibration nodes of the piezoelectric transformer, and are shaped into triangular prisms.

Figure 8:
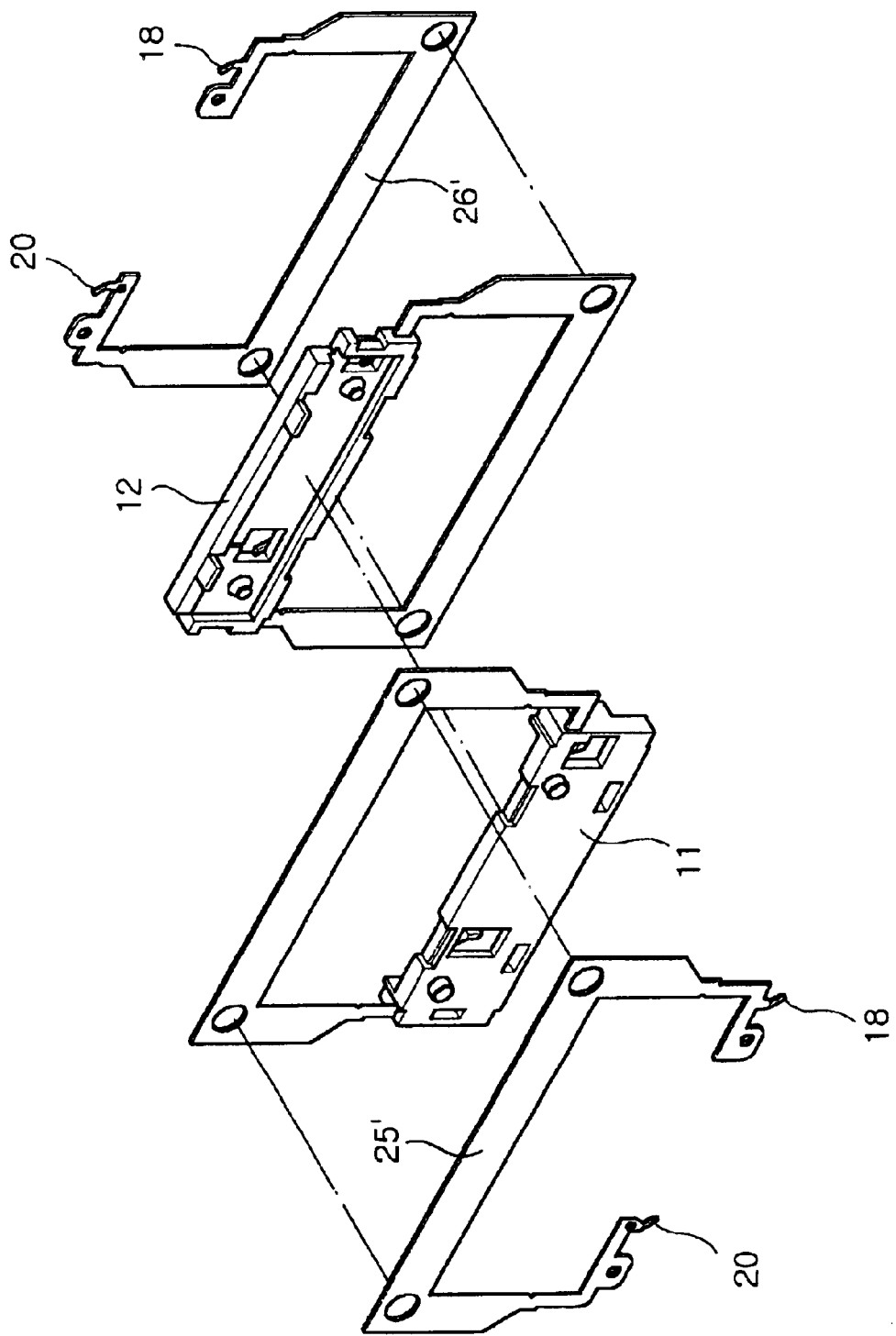
FIG. 8 is a view showing a manufacturing procedure of the housing for the single plate type piezoelectric transformer of FIG. 6b.

According to the method of manufacturing a housing of the present invention, it is also possible to use alternative lead frames 25' and 26' as shown in FIG. 8 to prepare output solder portions as shown in FIG. 6b. More specifically, so as to cause output solder portions to be protruded from end surfaces of the housing, output lead terminals are inserted into the housings via the end surfaces of the housings.

Although the method of manufacturing a housing for a piezoelectric transformer has been described with reference to the embodiment shown in FIG. 7, a housing for a laminated piezoelectric transformer shown in FIGS. 11 and 12 can also be manufactured by the same method. For example, lead frames are prepared from frames 41 and 42 as shown in FIG. 11. Frames 65 and 66 shown in FIG. 12 are also manufactured by the same method.

As described above, the present invention provides a contact structure of a piezoelectric transformer and a housing in which lead frames of a piezoelectric transformer are integrally formed with the housing to cause the lead frames to easily contact the piezoelectric transformer, and to prevent breakage of the contact.

Furthermore, the present invention provides a housing, which has lead frames, adapted to resiliently support a piezoelectric transformer to afford easy derivation of electrodes, stable housing structure and easy mounting of a piezoelectric transformer on a PCB.

In addition, the present invention can afford superior mechanical reliability, reduction of manufacturing cost, and a stable and effective process of manufacturing piezoelectric transformers.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A housing for receiving a piezoelectric transformer having a voltage input portion and a voltage output portion, both of which include a plurality of electrodes, said housing comprising:

an upper housing part having at least two first lead frames which extend to resiliently come into contact with a point of the input portion and a point of the output portion on an upper surface of the piezoelectric transformer; and a lower housing part having at least two second lead frames which extend to resiliently come into contact with a point of the input portion and a point of the output portion on a lower surface of the piezoelectric transformer;

wherein the first and second lead frames extend outwardly from the upper and lower housing parts, respectively, and the piezoelectric transformer is received in the upper and lower housing parts such that the piezoelectric transformer is resiliently supported by the first and second lead frames; and wherein the first and second lead frames, which are in contact with the output portion of the piezoelectric transformer at ends thereof, extend outwardly to the centers of output end surfaces of the upper and lower housing parts, respectively.

2. The housing as set forth in claim 1, in which the upper and lower housing parts are provided at side surfaces thereof with at least one set of hook and snap edge to couple the upper and lower housing parts to each other.

3. The housing as set forth in claim 1, in which at least one of the upper and lower housing parts is provided therein with a protrusion to support the piezoelectric transformer.

4. The housing as set forth in claim 3, in which the protrusion is shaped into a triangular prism which is oriented to be perpendicular to a lengthwise direction of the piezoelectric transformer.

5. The housing as set forth in claim 1, in which the first and second lead frames outwardly extended from the upper and lower housing parts are bent to be in contact with a lower surface of the lower housing part.

6. A housing for receiving a piezoelectric transformer having upper and lower surfaces and side surfaces connecting the upper and lower surfaces, and further having a voltage input portion and a voltage output portion, both of which include a plurality of electrodes, said housing comprising:

an upper housing part surrounding the upper surface and the side surfaces of the piezoelectric transformer, and having I) at least two first openings, and II) at least two first lead frames made of conductive elastic material, wherein each of said first lead frames extends from one of the side surfaces into the inside of one of the first openings of the upper housing part to be in contact with at least one electrode of the piezoelectric transformer; and a lower housing part surrounding the lower surface and the side surfaces of the piezoelectric transformer, and having i) at least two second openings, and ii) at least two second lead frames made of conductive elastic material, wherein each of said second lead frames extends from one of the side surfaces into the inside of one of the second openings of the lower housing part to be in contact with at least one electrode of the piezoelectric transformer;

wherein at least one of the first and second lead frames, which are in contact with at least one of the electrodes of the output portion of the piezoelectric transformer, extends to the center of an end surface of the upper and lower housing parts, respectively.

7. The housing as set forth in claim 6, in which the upper and lower housing parts are provided at side surfaces thereof with at least one set of hook and snap edge to couple the upper and lower housing parts to each other.

8. The housing as set forth in claim 6, in which at least one of the upper and lower housing parts is provided therein with a protrusion to support the piezoelectric transformer.

9. The housing as set forth in claim 8, in which the protrusion is shaped into a triangular prism which is oriented to be perpendicular to a lengthwise direction of the piezoelectric transformer.

10. The housing as set forth in claim 8, in which the protrusions are positioned at points corresponding to ¼ and ¾ of a full length of the piezoelectric transformer.

11. The housing as set forth in claim 6, which the first and second openings are positioned such that the input portion and the output portion of the piezoelectric transformer are exposed therethrough.

12. The housing as set forth in claim 6, in which ends of the first and second lead frames provided at side surfaces of the upper and lower housing parts are extended along side surfaces of the upper and lower housing parts and then bent to be in close contact with a lower surface of the lower housing part.

13. The housing as set forth in claim 6, in which ends of the first and second lead frames provided at side surfaces of the upper and lower housing parts are extended to side surfaces of the upper and lower housing parts and then bent to be in close contact therewith.

14. The housing as set forth in claim 6, in which the first and second lead frames, which are in contact with the input portion of the piezoelectric transformer, are positioned at a vibration node of the input portion of the piezoelectric transformer.

15. The housing as set forth in claim 14, in which when the piezoelectric transformer is in a λ vibration mode, the first and second lead frames, which are in contact with the input portion of the piezoelectric transformer, are positioned at a point corresponding to ¼ of a full length of the piezoelectric transformer.

16. The housing as set forth in claim 14, in which when the piezoelectric transformer is in a λ/2 vibration mode, the first and second lead frames, which are in contact with the input portion of the piezoelectric transformer, are positioned at a point corresponding to ½ of a full length of the piezoelectric transformer.

17. A housing for receiving a piezoelectric transformer having upper and lower surfaces and side surfaces connecting the upper and lower surfaces, and further having a voltage input portion and a voltage output portion at side surfaces thereof, both of said voltage input portion and said voltage output portion including a plurality of electrodes, said housing comprising:

a first housing part surrounding one of the side surfaces of the piezoelectric transformer on which the electrodes are formed, and having I) at least two first openings which are positioned at locations corresponding to the electrodes of the piezoelectric transformer, and II) at least two first lead frames made of conductive elastic material, wherein each of said first lead frames extends from a side surface into the inside of one of the first openings of the upper housing part to be in contact with at least one electrode of the piezoelectric transformer;

a second housing part surrounding the other of the side surfaces of the piezoelectric transformer on which the electrodes are formed, and having i) at least two second openings which are positioned at locations corresponding to the electrodes of the piezoelectric transformer, and ii) at least two second lead frames made of conductive elastic material, wherein each of said second lead frames extends from a side surface into the inside of one of the second openings of the lower housing part to be in contact with at least one electrode of the piezoelectric transformer; and a clip fitted on the center portion of the first housing part and the center portion of the second housing part to couple the first and second housing parts to each other.

18. The housing as set forth in claim 17, in which each of the first and second housing parts is shaped into a "U" form.

19. The housing as set forth in claim 17, in which the first and second housing parts are provided at end surfaces thereof with at least one set of hook and snap edge to couple the upper and lower housing parts to each other.

20. The housing as set forth in claim 19, in which the hooks are provided at both end surfaces of the first housing part, and the snap edges are provided at both end surfaces of the second housing part.

21. The housing as set forth in claim 17, in which at least one of the first and second housing parts is provided therein with a protrusion to support the piezoelectric transformer.

22. The housing as set forth in claim 21, in which the protrusion is shaped into a triangular prism which is oriented to be perpendicular to a lengthwise direction of the piezoelectric transformer.

23. The housing as set forth in claim 21, in which the protrusions are positioned at points corresponding to ¼ and ¾ of a full length of the piezoelectric transformer.

24. The housing as set forth in claim 17, in which the clip is shaped into a "U" form, and its both ends are engaged with the first and second housing parts.

25. The housing as set forth in claim 17, in which the clip is comprised of a metal plate.

26. The housing as set forth in claim 17, in which the first and second housing parts are provided at the center portions thereof with recesses in which the clip is fitted.

27. The housing as set forth in claim in which the first and second housing parts are provided at inner surfaces thereof with a plurality of supporters to support the piezoelectric transformer.

28. The housing as set forth in claim 27, in which the supporters are provided at lower portions of corners and the centers of the first and second housing parts such that the supporters provided at the first housing part and the supporters provided at the second housing part are arranged to face each other.

29. A piezoelectric transformer devices, comprising:

a piezoelectric transformer having rectangular upper and lower surfaces and side surfaces connecting the upper and lower surfaces, a longitudinal extent of said piezoelectric transformer being equally divided into two half parts, said piezoelectric transformer further having an input portion formed on the upper and lower surfaces in one of said two half parts of the piezoelectric transformer and an output portion formed on at least one of the side surfaces and a part of the upper surface adjacent to said at least one side surface in the other half part of the piezoelectric transformer;

an upper housing part surrounding the upper surface and the side surfaces of the piezoelectric transformer, and having I) at least two first openings exposing parts of the input and output portions, and II) at least two first lead frames made of conductive elastic material, wherein each of said first lead frames extends from one of the side surfaces into the inside of one of the first openings of the upper housing part to be in contact with the input and output portions of the piezoelectric transformer; and a lower housing part surrounding the lower surface and the side surfaces of the piezoelectric transformer, and having i) at least two second openings exposing parts of the input portion, and ii) at least two second lead frames made of conductive elastic material, wherein each of said second lead frames extends from one of the side surfaces into the inside of one of the second openings of the lower housing part to be in contact with a portion of the piezoelectric transformer adjacent to the output portion;

wherein at least one of the first and second lead frames, which are in contact with the half part of the piezoelectric transformer where the output portion is formed, extends to the center of an end surface of the upper and lower housing parts, respectively.

30. The piezoelectric transformer device as set forth in claim 29, in which the piezoelectric transformer is supported at its both sides by the first and second lead frames to be spaced from the upper and lower housing parts.

31. A piezoelectric transformer device, comprising:

a piezoelectric transformer having rectangular upper and lower surfaces and side surfaces connecting the upper and lower surfaces, and further having an input portion formed on the upper and lower surfaces and at least one of the side surfaces in a middle portion of the piezoelectric transformer, and an output portion formed on the upper and lower surfaces and at least one of the side surfaces at one end of the piezoelectric transformer;

an upper housing part surrounding the upper surface and the side surfaces of the piezoelectric transformer, and having I) at least two first openings exposing parts of the input and output portions, and II) at least two first lead frames made of conductive elastic material, wherein each of said first lead frames extends from one of the side surfaces into the inside of one of the first openings of the upper housing part to be in contact with the input and output portions of the piezoelectric transformer; and a lower housing part surrounding the lower surface and the side surfaces of the piezoelectric transformer, and having i) at least two second openings exposing parts of the input portion, and ii) at least two second lead frames made of conductive elastic material, wherein each of said second lead frames extends from one of the side surfaces into the inside of one of the second openings of the lower housing part to be in contact with the input and output portions of the piezoelectric transformer;

wherein at least one of the first and second lead frames, which are in contact with the output portion of the piezoelectric transformer, extends to the center of an end surface of the upper and lower housing parts, respectively.

32. The piezoelectric transformer device as set forth in claim 31, in which the piezoelectric transformer is supported at its both sides by the first and second lead frames to be spaced from the upper and lower housing parts.

33. The piezoelectric transformer device as set forth in claim 31, in which the upper and lower housing parts are provided at side surfaces thereof with at least one set of hook and snap edge to couple the upper and lower housing parts to each other.

34. The piezoelectric transformer device as set forth in claim 31, in which ends of the first and second lead frames provided at side surfaces of the upper and lower housing parts are extended to side surfaces of the upper and lower housing parts and then bent to be in close contact therewith.

35. A piezoelectric transformer device, comprising:

a piezoelectric transformer having rectangular upper and lower surfaces and side surfaces connecting the upper and lower surfaces, and further having an input portion formed on both side surfaces in a middle portion of the piezoelectric transformer, and an output portion formed on both side surfaces at one end of the piezoelectric transformer;

a first housing part surrounding one side surface of the both side surfaces on which the input and output portions are formed and end surfaces of the piezoelectric transformer which are adjacent to said one side surface, and having I) at least two first openings exposing parts of the input and output portions, and II) at least two first lead frames made of conductive elastic material, wherein each of said first lead frames extends from a side surface into the inside of one of the first openings of the first housing part to be in contact with the input and output portions the piezoelectric transformer;

a second housing part surrounding the other side surface of the both side surfaces on which the input and output portions are formed and end surfaces of the piezoelectric transformer which are adjacent to the other side surface, and having i) at least two second openings exposing parts of the input and output portions, and ii) second lead frames made of conductive elastic material, wherein each of said second lead frames extends from a side surface into the inside of one of the second openings of the lower housing part to be in contact with the input and output portions of the piezoelectric transformer; and a clip fitted on the center portion of the first housing part and the center portion of the second housing part to couple the first and second housing parts to each other.

36. The piezoelectric transformer device as set forth in claim 35, in which each of the first and second housing parts is shaped into a "U" form.

37. The piezoelectric transformer device as set forth in claim 35, in which the first and second housing parts are provided at end surfaces thereof with at least one set of hook and snap edge to couple the upper and lower housing parts to each other.

38. The piezoelectric transformer device as set forth in claim 37, in which the hooks are provided at both end surfaces of the first housing part, and the snap edges are provided at both end surfaces of the second housing part.

39. The piezoelectric transformer device as set forth in claim 35, in which the clip is shaped into a "U" form, and its both ends are engaged with the first and second housing parts.

40. The piezoelectric transformer device as set forth in claim 35, in which the clip is comprised of a metal plate.

41. The piezoelectric transformer device as set forth in claim 35, in which the first and second housing parts are provided at inner surfaces thereof with a plurality of supporters to support the piezoelectric transformer.

42. The piezoelectric transformer device as set forth in claim 41, in which the supporters are provided at lower portions of corners and the centers of the first and second housing parts such that the supporters provided at the first housing part and the supporters provided at the second housing part are arranged to face each other.

43. The piezoelectric transformer device as set forth in claim 35, in which ends of the first and second lead frames are extended to corner portions of lower surfaces of the first and second housing parts and then bent to be in close contact therewith.

44. The piezoelectric transformer device as set forth in claim 35, in which the piezoelectric transformer is provided at its center portion with means for attaching the clip to the piezoelectric transformer.

45. The piezoelectric transformer device as set forth in claim 44, in which the means for attaching the clip is adhesive containing silicon.

* * * * *